United States Patent
Ge et al.

(10) Patent No.: US 11,075,522 B2
(45) Date of Patent: Jul. 27, 2021

(54) CONTROL SYSTEM AND PHOTOVOLTAIC SYSTEM AND MICRO-GRID USING THE SAME AND METHOD THEREOF

(71) Applicant: ABB Schweiz AG, Baden (CH)

(72) Inventors: Junjie Ge, Beijing (CN); Xing Huang, Beijing (CN); Hailian Xie, Beijing (CN)

(73) Assignee: ABB Schweiz AG, Baden (CH)

( * ) Notice: Subject to any disclaimer, the term of this patent is extended or adjusted under 35 U.S.C. 154(b) by 223 days.

(21) Appl. No.: 16/258,897

(22) Filed: Jan. 28, 2019

(65) Prior Publication Data
US 2019/0173287 A1    Jun. 6, 2019

Related U.S. Application Data

(63) Continuation of application No. PCT/CN2016/100510, filed on Sep. 28, 2016.

(51) Int. Cl.
*H02J 3/38* (2006.01)
*G05F 1/67* (2006.01)
(Continued)

(52) U.S. Cl.
CPC .............. *H02J 3/383* (2013.01); *G05F 1/10* (2013.01); *G05F 1/67* (2013.01);
(Continued)

(58) Field of Classification Search
CPC .......... H02J 3/383; H02J 7/35; H02J 2300/24; G05F 1/10
See application file for complete search history.

(56) References Cited

U.S. PATENT DOCUMENTS

| | | | | |
|---|---|---|---|---|
| 3,489,915 A | * | 1/1970 | Engelhardt | G05F 1/67 307/66 |
| 2014/0327313 A1 | * | 11/2014 | Arditi | H02J 3/46 307/63 |
| 2017/0279376 A1 | * | 9/2017 | Siri | H02M 1/08 |

FOREIGN PATENT DOCUMENTS

| CN | 1797892 A | 7/2006 |
|---|---|---|
| CN | 102809980 A | 12/2012 |

(Continued)

OTHER PUBLICATIONS

State Intellectual Property Office of the P.R. China, International Search Report & Written Opinion issued in corresponding Application No. PCT/CN2016/100510, dated Jul. 4, 2017, 7 pp.

*Primary Examiner* — Adolf D Berhane
*Assistant Examiner* — Afework S Demisse
(74) *Attorney, Agent, or Firm* — Taft Stettinius & Hollister LLP

(57) ABSTRACT

A control system and photovoltaic system and micro-grid using the same and method thereof. The control system for controlling a photovoltaic converter includes: a first input, for receiving first signals indicating first sampling values of an input current of the photovoltaic converter provided by a solar panel; a second input, for receiving second signals indicating second sampling values of an input voltage of the photovoltaic converter provided by the solar panel; a third input, for receiving third signals indicating third sampling values of an output voltage of the photovoltaic converter; and a controller, for first regulating the output voltage of the photovoltaic converter in a direction towards a reference voltage based on the third sampling value by regulating the input voltage by first voltage change of a first predetermined level; wherein: the controller is further adapted for monitoring a trend of the input voltage and power provided by the solar panel based on the first sampling values and the second (Continued)

sampling values for the previous sampling time points and the current sampling time point, and suspending the first regulation in case that the trend changes. This allows for an improvement of transient response of the control system and preventing possible overshooting of a lower input voltage even when the solar panel operating point is relatively far away from the MPP.

20 Claims, 5 Drawing Sheets

(51) Int. Cl.
      *G05F 1/10*            (2006.01)
      *H01L 31/02*          (2006.01)
      *H02J 7/35*           (2006.01)

(52) U.S. Cl.
      CPC .......... *H01L 31/02021* (2013.01); *H02J 7/35* (2013.01); *Y02E 10/56* (2013.01); *Y02P 80/14* (2015.11)

(56) References Cited

FOREIGN PATENT DOCUMENTS

| | | |
|---|---|---|
| CN | 104753057 A | 7/2015 |
| JP | 2014007929 A | 1/2014 |

\* cited by examiner

CONTROL SYSTEM AND PHOTOVOLTAIC SYSTEM AND MICRO-GRID USING THE SAME AND METHOD THEREOF

TECHNICAL FIELD

The invention relates to regulating output voltage of a photovoltaic system with a predetermined voltage value as reference, and more particularly to regulating output voltage of photovoltaic converter in consideration of maximum power point available from solar panel of the photovoltaic system.

BACKGROUND ART

The photovoltaic system is quite popular as a renewable source in many applications. Its solar panel has the maximum power point (MPP) phenomenon, which means the solar panel outputs the maximum power at a certain point that is not the end of the operation range. Moreover, the output power of the solar panel can vary with the temperature and the irradiation.

FIG. 1A is a P-V curve of a solar panel illustrating the MPP phenomenon. As show in FIG. 1A, an output power of solar panel increases with an increase of the solar panel output voltage in a direction towards the MPP in region A. In contrast, an output power of solar panel decreases with an increase of the solar panel output voltage in a direction away from the MPP in region B. FIG. 1B schematically depicts different P-V curves of a solar panel for various operational conditions. As shown in FIG. 1B, the location of MPP varies with the operational conditions of the solar panel, such as its temperature and the irradiation intensity.

For this reason, photovoltaic systems typically comprise a control system that varies the match between the load and impedance of its converter circuit connected to the solar panel in order to ensure a switching between modes of voltage source control and maximum power point track control. For example, in patent CN 104753057 A, it discloses a direct current micro-grid and photovoltaic power unit with seamless switching method between maximum power tracking mode and droop control mode. An operating point of the boost converter is regulated to reach a maximum power point (MPP) of the photovoltaic array to maintain stable output power when direct current bus voltage fluctuation is suppressed by a closed loop. This prior art solution requires a pre-condition that the MPP of the photovoltaic array is known a priori, for example, by strategy of Perturb and Observe (P&O). Where the operator desires to operate the photovoltaic system at its maximum power point, the droop curve of the converter is down-shifted so as to achieve a change of the power output by the photovoltaic array, and thus in the end the photovoltaic array reaches its maximum power point. In this case, it is not the electrical parameters of the photovoltaic system that is considered for triggering the switching between the voltage source control and maximum power control, but the command which is issued by the operator. This may bring about disadvantage of system instability during the transient state of the switching. FIG. 1C schematically depicts solar panel output power curve and photovoltaic converter output voltage in an unstable transient state. As shown in FIG. 1C, a steady state remains until to where there is an increase of load power $P_{load}$. Starting from $t_0$ to $t_1$ where the solar panel operates in the region A of FIG. 1A, the photovoltaic converter is regulated by a control strategy so that the solar panel output power $P_{pv}$ increases with a damped response of the photovoltaic converter output voltage $U_{out}$ until the solar panel reaches its maximum power point $P_{max}$. If the control strategy remains unchanged where after $t_1$ the converter still wants to increase the output power, but the unchanged control strategy will lead to the decrease of output power $P_{pv}$ because the operating point of the solar panel enters into region B of FIG. 1A. Thus, the output voltage $U_{out}$ will decrease continuously but more power is still required from the PV converter. In the end, the power balance cannot be achieved and the system breaks down.

BRIEF SUMMARY OF THE INVENTION

According to an aspect of present invention, it provides a control system for controlling a photovoltaic converter, including: a first input, for receiving first signals indicating first sampling values of an input current of the photovoltaic converter provided by a solar panel; a second input, for receiving second signals indicating second sampling values of an input voltage of the photovoltaic converter provided by the solar panel; a third input, for receiving third signals indicating third sampling values of an output voltage of the photovoltaic converter; and a controller, for first regulating the output voltage of the photovoltaic converter in a direction towards a reference voltage based on the third sampling value by regulating the input voltage by first voltage change of a first predetermined level; wherein: the controller is further adapted for monitoring a trend of the input voltage and power provided by the solar panel based on the first sampling values and the second sampling values for the previous sampling time points and the current sampling time point, and suspending the first regulation in case that the trend changes.

According to another aspect of present invention, it provides a control method for controlling a photovoltaic converter, including: receiving first signals indicating first sampling values of an input current of the photovoltaic converter provided by a solar panel; receiving second signals indicating second sampling values of an input voltage of the photovoltaic converter provided by the solar panel; receiving third signals indicating third sampling value of an output voltage of the photovoltaic converter; and monitoring a trend of the input voltage and power of the solar panel based on the first sampling values and the second sampling values for the previous sampling time points and the current sampling time point, in case that the trend remains unchanged, first regulating the output voltage of the photovoltaic converter based on the third sampling value in a direction towards a reference voltage by first regulating the input voltage by first voltage change of a first predetermined level, otherwise suspending the first regulation.

According to another aspect of present invention, it provides a photovoltaic system using the control system, which further includes the solar panel and the photovoltaic converter for outputting the output voltage of the photovoltaic converter at its output.

According to another aspect of present invention, it provides a micro-grid including: a bus and the photovoltaic system; wherein: the output of the photovoltaic converter of the photovoltaic system is electrically coupled to the bus.

MPPT algorithms typically use some form of dithering to determine a derivative of the power vs. voltage conditions, or to determine and maintain operation at the maximum power point. The skilled person should understand that the MPP may be predicted by a calculation model in consideration of those parameters, but which would require several steps of perturbation and observation to arrive at a relatively accurate location of the MPP, and then control strategy, such as voltage control, may be applied to regulate the converter output voltage with the solar panel operating at the MPP. In contrast to this, according to the technical solution according to present invention, the operating point of solar panel is dynamically regulated around its MPP within an allowable distance, whose exact position is un-known to the controller, while the voltage control is performed in a manner of step-by-step. Since it may no longer be necessary or desirable to hold the voltage control waiting for the outcome of MPP calculation and then decide between voltage control and power control, this hybrid mode operation, having an inner control loop for voltage regulation and an outer loop for setting the "Switch" signal for the inner control loop, allows for an improvement of transient response of the control system. In addition, by having the dual-loop structure in the control system, stability of the system is improved allowing fast acquisition and tracking of the system during transients. Since the solution according to present invention prioritizes power control of the solar panel to the converter output voltage control, it is applicable to have the inner loop for PV converter output voltage regulation without a separate algorithm for locating the MPP as accurate as the conventional. Regulation of the rate of change of the PV converter input voltage has the effect that the inner control loop which is used for setting the PV converter output voltage can follow a predetermined reference voltage value without any overshoots. This makes it possible to prevent possible overshooting of a lower input voltage even when the solar panel operating point is relatively far away from the MPP.

Preferably, the controller is further adapted for second regulating the input voltage by a second voltage change of a second predetermined level in a direction opposite to the first voltage change in case that the trend changes. In summary, the controller can regulate (second regulation) the input voltage by a second voltage change of a second predetermined level in a direction opposite to the first voltage change in case that the trend changes. Therefore, the operating point of the solar panel is dynamically adjusted around its MPP within an allowable distance, whose exact position is un-known to the controller. This allows the solar panel to work at an operating point relatively close to MPP during the dominance of the outer loop in the transient state. In addition, because the inner loop keeps regulating the PV converter input voltage in the manner of step-by-step where the solar panel operating point has shifted from one region to the other, for example from region A to region B and vice versa as shown in FIG. 1A, the dual-loop structure in the control system can still operate with the same control strategy where the photovoltaic system works in the other region, for example in region B.

Preferably, for the first regulation and the second regulation, the controller is further adapted for provide control signals to the photovoltaic converter, such like PWM signals.

Preferably, the controller is further adapted for adjusting the first predetermined level depending on a level of voltage difference between the output voltage and the reference voltage, and the first predetermined level increases as the level of voltage difference increases. Owing to such dependence, it is possible to achieve that a quicker adjustment of the PV converter output voltage can take place in a noncritical range of the PV converter input voltage range, as a result of which a good response of the voltage control with a changing working point of the solar panel is ensured in this range.

Preferably, the controller is further adapted for adjusting the first predetermined level depending on a level of the solar panel power difference between present sampling time point and the previous sampling point, and the first predetermined level increases as the level of the solar panel power difference increases. Owing to such dependence, it is possible to achieve that a quicker adjustment of the PV converter output voltage can take place in a noncritical range of the PV converter input voltage range, as a result of which a good response of the voltage control with a changing working point of the solar panel is ensured in this range.

Similarly, the controller is further adapted for: adjusting the second predetermined level depending on a level of voltage difference between the output voltage and the reference voltage, and the second predetermined level increases as the level of voltage difference increases; or adjusting the second predetermined level depending on a level of the solar panel power difference between present sampling time point and the previous sampling point, and the second predetermined level increases as the level of the solar panel power difference increases.

Preferably, the trend is that the input voltage increases while the output power of the solar panel increases and vice versa.

BRIEF DESCRIPTION OF THE DRAWINGS

The subject matter of the invention will be explained in more detail in the following text with reference to preferred exemplary embodiments which are illustrated in the drawings, in which.

The reference symbols used in the drawings, and their meanings, are listed in summary form in the list of reference symbols. In principle, identical parts are provided with the same reference symbols in the figures.

PREFERRED EMBODIMENTS OF THE INVENTION

Figure 2:
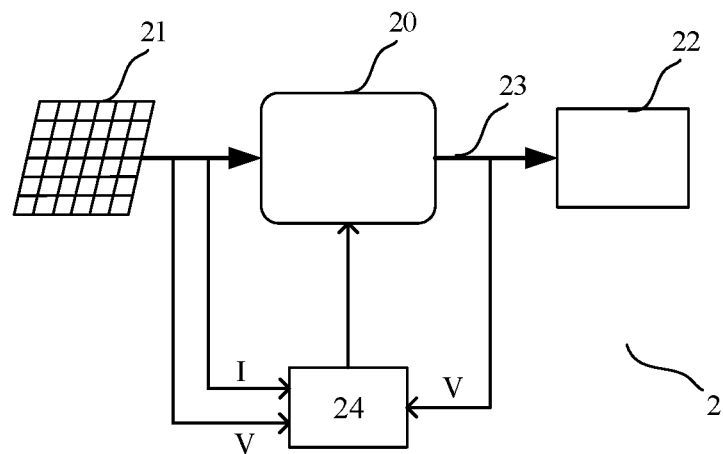
FIG. 2 shows an example of diagram of a photovoltaic system according to an embodiment of present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected". FIG. 2 shows an example of diagram of a photovoltaic system according to an embodiment of present invention. As shown in FIG. 2, in the photovoltaic system 2, many non-idealities may be mitigated by utilizing a photovoltaic converter (PV converter) 20, such as a DC/DC converter or a similar power converter, behind solar panel 21, to adapt the coupled solar panel's power transfer to a PV converter 20 via a bus 23 which connects the solar panel together via the DC/DC converter.

Figure 3:
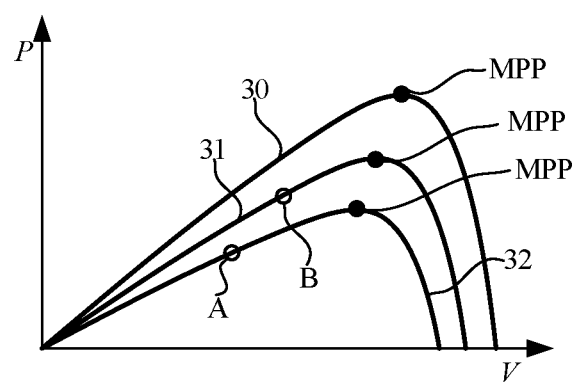
FIG. 3 shows an example of the P/V (power/voltage) characteristics for solar panel under three sustainably different operation conditions.

In this scenario where only the photovoltaic converter 20 supplies power to the DC load 22, the PV converter 20 may operate as a voltage source converter and its output voltage may be controlled to be substantially constant by control system 24. For example, the duty cycle of the PV converter 20 may be controlled in any suitable fashion, e.g. by means of pulse width modulation. Such techniques are well-known per se and will therefore not be further discussed for the sake of brevity. FIG. 3 shows an example of the P/V (power/voltage) characteristics for solar panel under three sustainably different operation conditions. The graph 3 in FIG. 3 shows P/V curves for a given solar panel under three substantially different conditions in terms of temperature and irradiation intensity. For example, P/V curve 30 corresponds to a first temperature and a first irradiation, P/V curve 31 corresponds to a second temperature and a second irradiation, and P/V curve 32 corresponds to a third temperature and a third irradiation. Each curve 30, 31, 32 has its maximum power point (MPP), that is, the point at which the product of the current and voltage output by the solar panel is at its maximum. The PV converter 20 and the DC load 22 represent a load sensed by the solar panel 21, which governs the operating point on the P/V curves 30, 31, 32 of the solar panel 21. By variation of the duty cycle of the PV converter 20, the impedance of the load may be varied, such that the load characteristics and the load curve may be tuned to intersect the P/V curves 30, 31, 32 of the solar panel 21. For example, the PV system 2 initially exhibits P/V characteristics as depicted by P/V curve 32, with the PV converter 20 being configured to operate at point A by appropriate control of the duty cycle of the PV converter 20. The P/V characteristics of the PV system 2 may change, e.g. because of changing illumination conditions, causing the PV system 2 to adopt P/V characteristics depicted by P/V curve 31. This causes the operating point of the PV system 2 to shift from point A to point B, which is relatively far removed from its initial position, such that the PV system 2 now operates under a P/V curve that is new and not known a prior.

Figure 4:
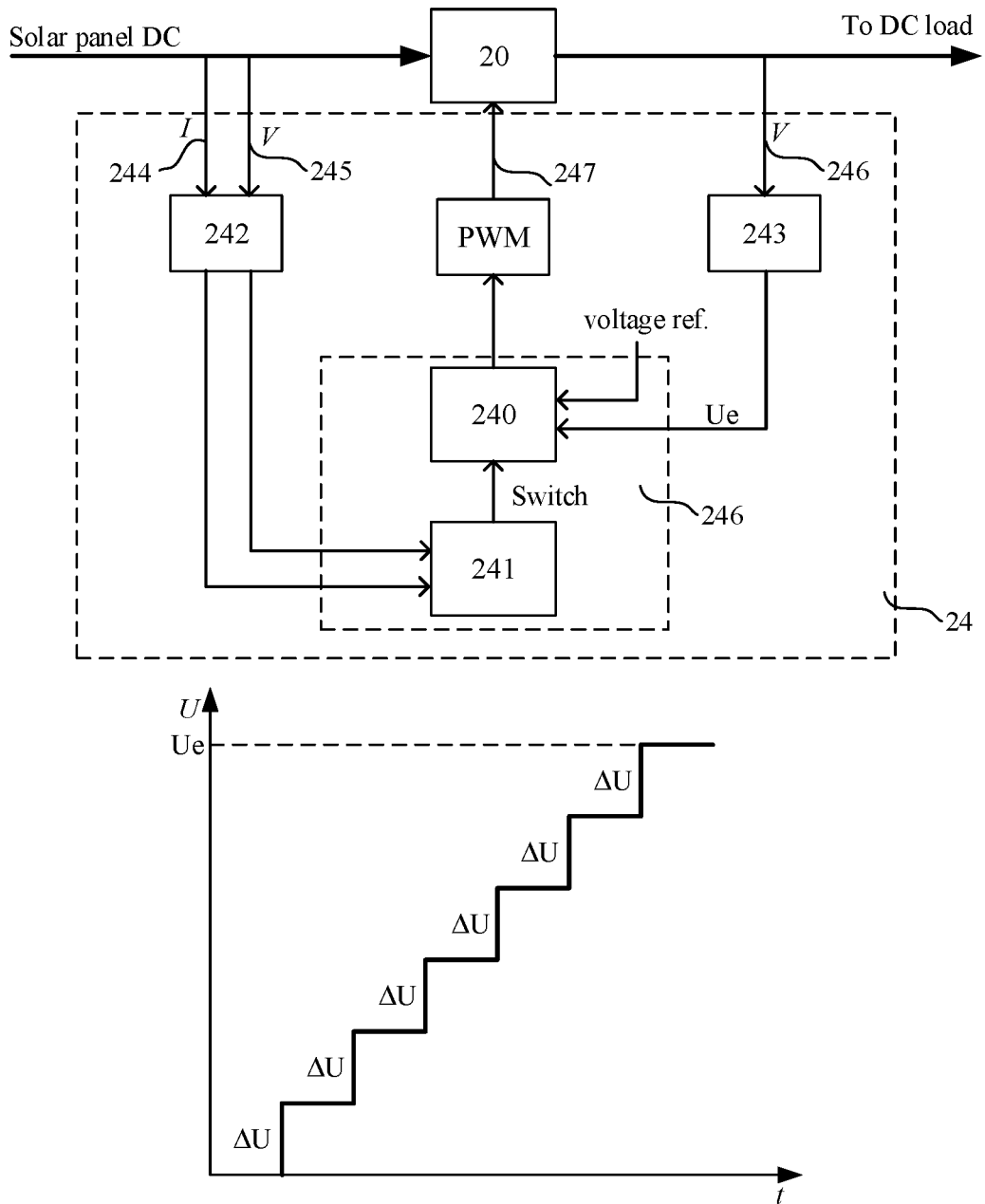
FIG. 4 shows a control system for controlling the photovoltaic system according to an embodiment of present invention for achieving voltage control.

FIG. 4 shows a control system for controlling the photovoltaic system according to an embodiment of present invention for achieving voltage control. The control system 24 may include an inner control loop, which may be a voltage regulating loop 240, and a solar panel power loop 241 utilized to set the "Switch" signal for the inner control loop 240. In the embodiment shown, the Switch signal is the command for switching between modes of voltage control and power control of the inner control loop 240. The Switch signal may be provided by the solar panel power loop 241 in the form of a control signal, whether analog or digital, to the inner voltage regulating loop 240, to determine which mode the control system 24 should regulate to. A/D converter 242 may be used to sense and sample the input voltage and current obtained from the solar panel 21, and A/D converter 243 may be used to sense and sample the voltage and current output by PV converter 20. However, in case of analog implementations, there is no need for A/D converters 242 and 243. Inner control loop 240 may be designed to monitor one input (V received from the output of PV converter 20), and the outer control loop 241 may be designed to monitor two inputs (I and V received from the output of the solar panel 21).

The inner loop 240 may directly control the DC/DC conversion duty-cycle of PWM control signal for switching converter 20. The inner control loop 240 is designed for regulating the input voltage of the PV converter 20 following a predetermined voltage reference in a manner of step-by-step, which is shown in FIG. 4. The level of the intermediate error between the PV converter output voltage (sampling value) and the predetermined voltage reference $U_e$ is in this case plotted on the y axis of the graph and the progression of time t is plotted on the x axis of the graph. A voltage increment of a predetermined level $\Delta U$ in the direction of a higher or lower intermediate voltage is performed starting from an up-to-date value for the error $U_e$ with the step increment of the voltage as provided by the solar panel 21. For the error $U_e$ thus changed, the output voltage of the PV converter 20 is regulated approaching the voltage reference value, unless it is suspended by the command from the outer loop 241. The time interval of the step allows for a duration when the A/D converter 242 may sense and sample the input voltage and current obtained from the solar panel 21 before and right after its operating point shift across the MPP. Preferably, the sampling interval is set shorter or equal to the step time interval.

Figure 5:
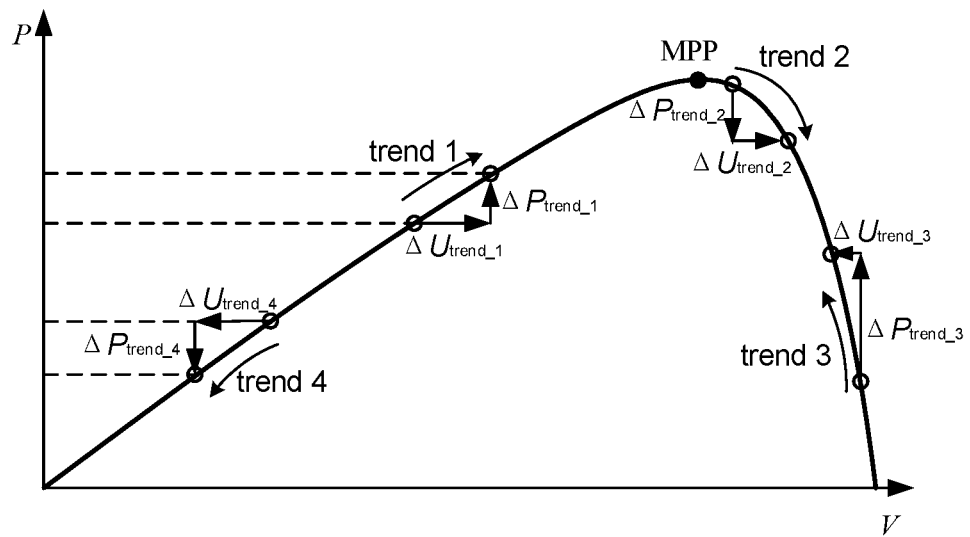
FIG. 5 shows typical trends of input voltage and power provided by a solar panel.
Figure 6:
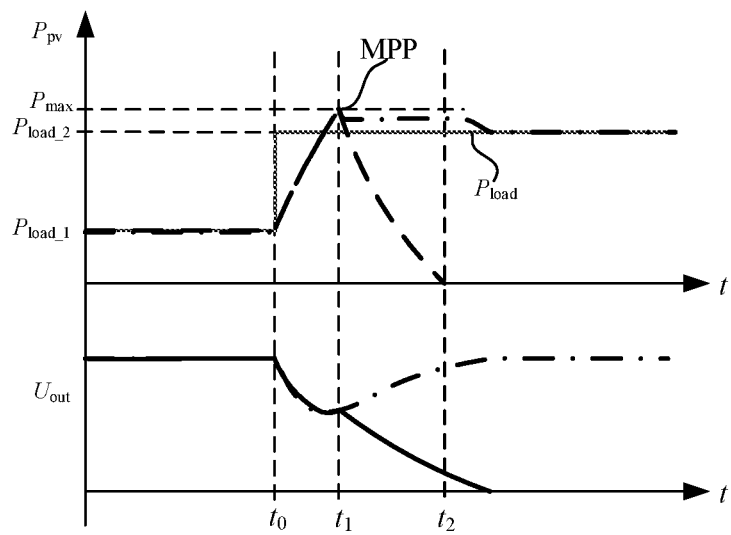
FIG. 6 shows an example of transient state and steady state of the photovoltaic system according to an embodiment concerning voltage control.

The outer solar panel power loop 241 may continually monitor each step of the PV converter input voltage and its power (power=voltage*current) so as to determine a trend of the input voltage and power provided by the solar panel 21 to instruct the inner loop 240 if the voltage control or the power control should be performed. FIG. 5 shows typical trends of input voltage and power provided by a solar panel. As shown in FIG. 5, trend 1 is located on the left of the MPP, and moves towards the MPP; trend 2 is located on the right of the MPP, and moves away from the MPP; trend 3 is located on the right of the MPP, and moves towards the MPP; trend 4 is located on the left of the MPP, and moves away from the MPP. For the trend 1 and the trend 4, the trend of the input voltage and the power supplied by the solar panel for the previous sampling time point and the current sampling time point are in the same direction (i.e. $\Delta P*\Delta U>0$); For the trend 2 and the trend 3, the trend of the input voltage and the power supplied by the solar panel for the previous sampling time point and the current sampling time point are in the opposite direction (i.e. $\Delta P*\Delta U<0$). An example of transient state and steady state of the photovoltaic system according to an embodiment concerning voltage control is shown in FIG. 6. As shown in FIG. 6, the transient state starts when the DC load 22 increases suddenly from Pload_1 to Pload_2 at time point t0, the PV converter 20 may be controlled to adapt its impedance to converting more input power supplied from the solar panel 21 into power supplied to the DC load 22, in an time interval starting from time point t0 to t2, and the solar panel power output exhibits underdamped response. In such transient state, when the trend 1 continues and the operating point of the solar panel 21 reaches the MPP, the PV converter 20 is still controlled to increase the output power (plotted on the dash curve), but the regulation will lead to the decrease of output power as explained in accompanying FIG. 1A. Thus, the output voltage (plotted on the dash curve) will decrease continuously and more power is still required from the PV converter, because the PV converter does not know the location of MPP a prior and the control strategy is remained unchanged. At last, the power balance cannot be achieved and the system breaks down. The outer loop 214 may monitor a change of the trend of the input voltage and power as provided by the solar panel 21 so as to determine if the solar panel's operating point shifts across the MPP which is not known a prior. Below is a table summarizing an indicator for a trend change in consideration of changes of the solar panel output power and voltage based on the description in accompanying FIG. 5.

TABLE I

| Previous trend | Current Trend | Solar Panel Power & Voltage | Trend Change |
|---|---|---|---|
| Trend 1 | Trend 1 | $\Delta P_{trend\_1} * \Delta U_{trend\_1} > 0$ | Unchanged |
| Trend 1 | Trend 2 | $\Delta P_{trend\_1} * \Delta U_{trend\_1} > 0$ $\Delta P_{trend\_2} * \Delta U_{trend\_2} < 0$ | Changed |
| Trend 1 | Trend 3 | $\Delta P_{trend\_1} * \Delta U_{trend\_1} > 0$ $\Delta P_{trend\_3} * \Delta U_{trend\_3} < 0$ | Changed |
| Trend 1 | Trend 4 | $\Delta P_{trend\_1} * \Delta U_{trend\_1} > 0$ $\Delta P_{trend\_4} * \Delta U_{trend\_4} > 0$ | Unchanged |
| Trend 2 | Trend 1 | $\Delta P_{trend\_2} * \Delta U_{trend\_2} < 0$ $\Delta P_{trend\_1} * \Delta U_{trend\_1} > 0$ | Changed |
| Trend 2 | Trend 2 | $\Delta P_{trend\_2} * \Delta U_{trend\_2} < 0$ $\Delta P_{trend\_2} * \Delta U_{trend\_2} < 0$ | Unchanged |
| Trend 2 | Trend 3 | $\Delta P_{trend\_2} * \Delta U_{trend\_2} < 0$ $\Delta P_{trend\_3} * \Delta U_{trend\_3} < 0$ | Unchanged |
| Trend 2 | Trend 4 | $\Delta P_{trend\_2} * \Delta U_{trend\_2} < 0$ $\Delta P_{trend\_4} * \Delta U_{trend\_4} > 0$ | Changed |
| Trend 3 | Trend 1 | $\Delta P_{trend\_3} * \Delta U_{trend\_3} < 0$ $\Delta P_{trend\_1} * \Delta U_{trend\_1} > 0$ | Changed |
| Trend 3 | Trend 2 | $\Delta P_{trend\_3} * \Delta U_{trend\_3} < 0$ $\Delta P_{trend\_2} * \Delta U_{trend\_2} < 0$ | Unchanged |
| Trend 3 | Trend 3 | $\Delta P_{trend\_3} * \Delta U_{trend\_3} < 0$ $\Delta P_{trend\_3} * \Delta U_{trend\_3} < 0$ | Unchanged |
| Trend 3 | Trend 4 | $\Delta P_{trend\_3} * \Delta U_{trend\_3} < 0$ $\Delta P_{trend\_4} * \Delta U_{trend\_4} > 0$ | Changed |
| Trend 4 | Trend 1 | $\Delta P_{trend\_4} * \Delta U_{trend\_4} > 0$ $\Delta P_{trend\_1} * \Delta U_{trend\_1} > 0$ | Unchanged |
| Trend 4 | Trend 2 | $\Delta P_{trend\_4} * \Delta U_{trend\_4} > 0$ $\Delta P_{trend\_2} * \Delta U_{trend\_2} < 0$ | Changed |
| Trend 4 | Trend 3 | $\Delta P_{trend\_4} * \Delta U_{trend\_4} > 0$ $\Delta P_{trend\_3} * \Delta U_{trend\_3} < 0$ | Changed |
| Trend 4 | Trend 4 | $\Delta P_{trend\_4} * \Delta U_{trend\_4} > 0$ $\Delta P_{trend\_4} * \Delta U_{trend\_4} > 0$ | Unchanged |

Consequently, the outer loop 241 may issue command to the inner loop 240 if to continue with the current voltage control strategy or have it suspended. Back referring to FIG. 6, where the outer loop 241 identifies such a trend change, for example a trend change resulting from migration from trend 1 to trend 2, the inner loop 240 may maintain the current duty-cycle of PWM signal constant so as to maintain the match between the load and impedance of the PV converter 20. Therefore, the operating point of the solar panel 21 is prevented from moving away from the MPP and consequently the transient stability issue is solved. The power curve and voltage curve are plotted on the dot-dash-curve in FIG. 6. As another example, a trend change resulting from migration from trend 3 to trend 4, where migration direction of the operating point is opposite to the example above, the inner loop 240 may keep the current duty-cycle of PWM signal constant so as to maintain the match between the load and impedance of the PV converter 20. Therefore, the operating point of the solar panel 21 is prevented from moving away from the MPP and consequently the transient stability issue is solved. MPPT algorithms typically use some form of dithering to determine a derivative of the power vs. voltage conditions, or to determine and maintain operation at the maximum power point. The skilled person should understand that the MPP may be predicted by a calculation model in consideration of those parameters, but which would require several steps of perturbation and observation to arrive at a relatively accurate location of the MPP, and then control strategy, such as voltage control, may be applied to regulate the converter output voltage with the solar panel operating at the MPP. In contrast to this, according to the control system according to present invention, the operating point of solar panel is dynamically regulated around its MPP within an allowable distance, whose exact position is un-known to the controller. Since it may no longer be necessary or desirable to hold the voltage control waiting for the outcome of MPP calculation and then decide between voltage control and power control, this hybrid mode operation allows for an improvement of transient response of the control system.

In addition, by having the dual-loop structure in the control system 24, stability of the system is improved allowing fast acquisition and tracking of the system during transients. The inner control loop may be a voltage regulating loop 240, and the outer loop 241 utilized to set the "Switch" signal for the inner control loop 240. Since the solution according to present invention prioritizes power control of the solar panel to the converter output voltage control, it is applicable to have the inner loop for PV converter output voltage regulation without a separate algorithm for locating the MPP as accurate as the conventional.

Accordingly, the control system 24 for controlling the photovoltaic converter 20 includes a first input 244 for receiving first signals indicating first sampling values of an input current of the photovoltaic converter 20 provided by the solar panel 21, a second input 245 for receiving second signals indicating second sampling values of an input voltage of the photovoltaic converter 20 provided by the solar panel 21, a third input 246 for receiving third signals indicating third sampling values of an output voltage of the photovoltaic converter, and a controller 247 for first regulating the output voltage of the photovoltaic converter 20 in a direction towards the reference voltage based on the third sampling value by regulating the input voltage as provided by the solar panel 21 by first voltage change of a first predetermined level $\Delta U$. The controller 247 is further adapted for monitoring a trend of the input voltage and power provided by the solar panel based on the first sampling values and the second sampling values for the previous sampling time points and the current sampling time point, and suspending the first regulation in case that the trend changes. It may also include an output port to provide the control signal to PV converter 21 via PWM.

In one embodiment, the inner loop 240 may include a hardware PWM controller generating the PWM control signal 247 using analog and digital hardware functions, for a fully hardware-based control system. In another embodiment, the inner loop 240 include a microcontroller based system utilizing A/D and PWM peripherals implementing the fast tracking loop as a combination of hardware and firmware. Choices of embodiments including hardware and/or software implementations or a combination thereof may be based upon cost and performance criteria for the intended system while maintaining equivalence from an architectural perspective disclosed in at least FIG. 4.

Figure 1A:
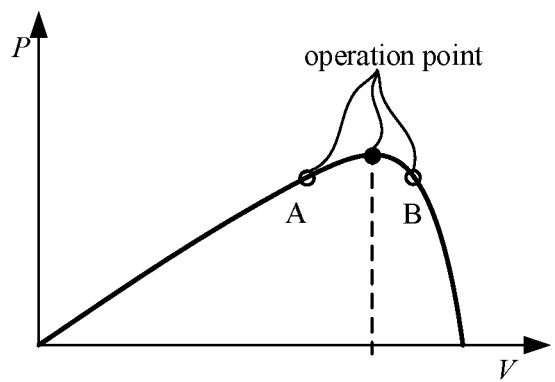
FIG. 1A is a P-V curve of a solar panel illustrating the MPP phenomenon.
Figure 1B:
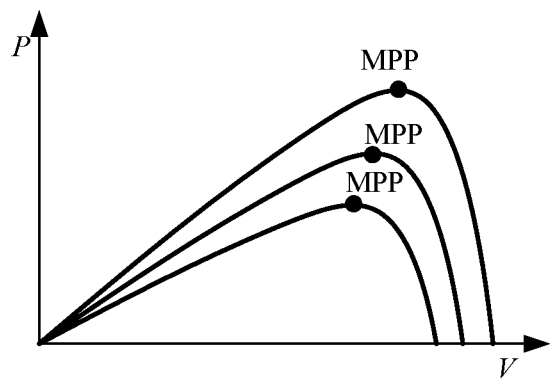
FIG. 1B schematically depicts different P-V curves of a solar panel for various operational conditions.
Figure 1C:
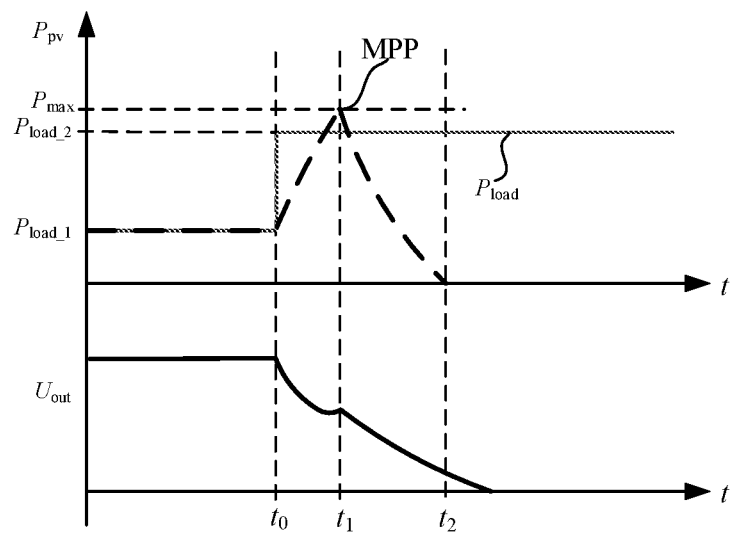
FIG. 1C schematically depicts solar panel output power curve and photovoltaic converter output voltage in an unstable transient state.

It is desirable to operate a photovoltaic converter control system with keeping the solar panel operating point within region A or B as shown in FIG. 1A even the solar panel operating point has shifted from one to the other across the MPP. Back to the example of FIG. 6, where the outer loop 241 identifies a trend change resulting from migration from trend 1 to trend 2, the outer loop 241 may issue command to the inner loop 240 to decrease the current duty-cycle of PWM signal where it has been increases until the outer loop 241 issued the Switch command. Meanwhile, the inner loop 240 follows the step-by-step manner as described above, and the operating point of the solar panel 21 follows the trend 3 as shown in FIG. 5. Therefore, the solar panel output power starts to increase again. The outer loop 241 continues to monitor the voltage and power as provided by the solar panel 21 to see if any change to the trend 3 occurs, for example the trend 3 changes to trend 4 after crossing the MPP. Where such change is identified, the control system 24 reverses the shifting direction of the operating point again, from trend 4 to trend 1. As regards to the other example of FIG. 6, where the trend change resulting from migration from trend 3 to trend 4, similarly, where the outer loop 241 identifies a trend change resulting from migration from trend 3 to trend 4, the outer loop 241 may issue command to the inner loop 240 to increase the current duty-cycle of PWM signal where it has been decreased until the outer loop 241 issued the Switch command. Meanwhile, the inner loop 240 follows the step-by-step manner as described above, and the operating point of the solar panel 21 follows the trend 1 as shown in FIG. 5. Therefore, the solar panel output power starts to increase again. The outer loop 241 continues to monitor the voltage and power as provided by the solar panel 21 to see if any change to the trend 2 occurs, for example the trend 1 changes to trend 2 after crossing the MPP. Where such change is identified, the control system 24 reverses the shifting direction of the operating point again, from trend 2 to trend 3. In summary, the controller 24 can regulate (second regulation) the input voltage by a second voltage change of a second predetermined level in a direction opposite to the first voltage change in case that the trend changes.

Therefore, the operating point of the solar panel is dynamically adjusted around its MPP within an allowable distance, whose exact position is un-known to the controller. This allows the solar panel to work at an operating point relatively close to MPP during the dominance of the outer loop in the transient state. In addition, because the inner loop keeps regulating the PV converter input voltage in the manner of step-by-step where the solar panel operating point has shifted from one region to the other, for example from region A to region B and vice versa as shown in FIG. 1A, the dual-loop structure in the control system can still operate with the same control strategy where the photovoltaic system works in the other region.

Variable Step for PV Converter Working as Voltage Source Converter

In order to improve the performance of the control system 24, the increase or decrease step value of the PV panel voltage in FIG. 4 can be variable like the variable step method of MPPT. In different applications, the variable step method of the control system 24 can be different. The PV converter 20 works as a voltage source to supply power to the DC load 22 by setting constant voltage reference. The regulation step value of the solar panel voltage is related to the difference of output voltage and its reference voltage. The regulation step value can be proportional to the absolute value of difference according to equation (1).

$$\Delta u_{se}=|U_{o\_ref}-U_o|*k_p \qquad (1)$$

Wherein, $\Delta U_{se}$ indicates the voltage step as provided by the solar panel, $U_{o\_ref}$ indicates the voltage reference value, $U_{o\_ref}$ indicates the value of the output voltage of the PV converter, and $K_p$ indicates a predetermined factor.

Then the larger the difference of output voltage and its reference voltage is, the larger the regulation step value is and the faster the regulation speed is.

As an alternative, the step voltage regulation is applicable in consideration of the power supplied by the solar panel 22 according to equation (2).

$$\Delta u_{se}=|P_{o\_ref}-P_o|*k_p \qquad (2)$$

Wherein, $\Delta U_{se}$ indicates the voltage step as provided by the solar panel, $P_{o\_ref}$ indicates the voltage reference value, $P_{o\_ref}$ indicates the value of the output voltage of the PV converter, and $K_p$ indicates a predetermined factor.

In summary, the controller 246 may adjust the first predetermined level depending on a level of voltage difference between the output voltage and the reference voltage, and the first predetermined level increases as the level of voltage difference increases, or adjust the first predetermined level depending on a level of the solar panel power difference between present sampling time point and the previous sampling point, and the first predetermined level increases as the level of the solar panel power difference increases. In addition, the controller 246 may adjust the second predetermined level depending on a level of voltage difference between the output voltage and the reference voltage, and the second predetermined level increases as the level of voltage difference increases; or adjust the second predetermined level depending on a level of the solar panel power difference between present sampling time point and the previous sampling point, and the second predetermined level increases as the level of the solar panel power difference increases.

Figure 7:
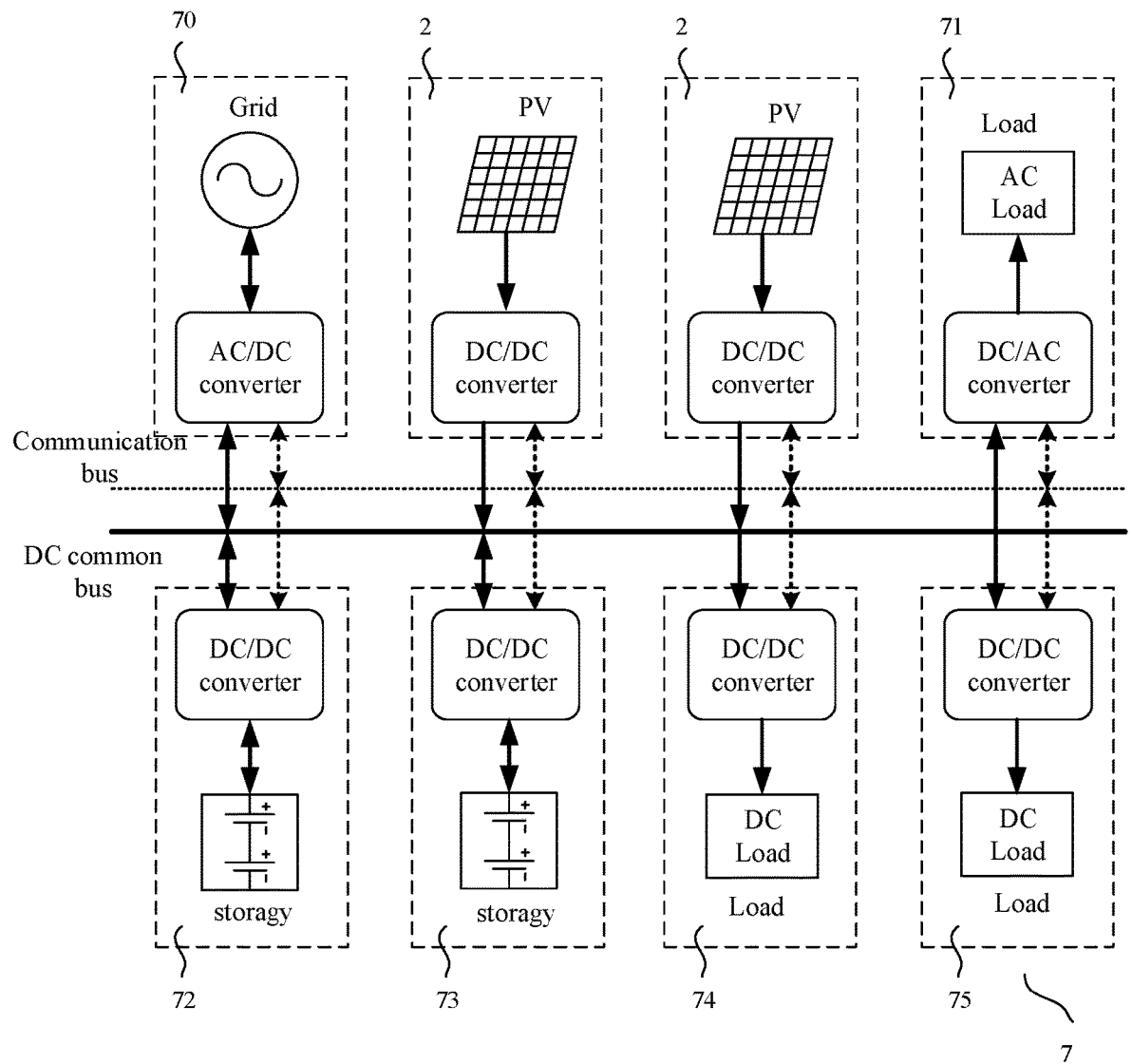
FIG. 7 illustrates a micro-grid according to an embodiment of present invention.

FIG. 7 illustrates a micro-grid according to an embodiment of present invention. As shown in FIG. 7, the micro-grid 7 includes at least one photovoltaic system 2. In the example, a first photovoltaic system 2 and a second photovoltaic system 2 having their buses 23 coupled to a common bus 70 together with the other power generators 70, 71, 72, 73, 74 75. There is no communication like among the first photovoltaic system 2, the second photovoltaic system 2 and the other power generators 70, 71, 72, 73, 74 75. The first photovoltaic system 2 and the second photovoltaic system 2 are involved in control of voltage fluctuation of the common bus 70.

For example, when the common bus 70 voltage is larger than a first voltage, the regulation step value of the solar panel voltage is related to the difference of output voltage of each PV converter and its reference voltage, which is related to the PV converter output power or current. The regulation step value can be proportional to the absolute value of difference in accordance of equation (1).

When the common bus voltage is smaller than a second voltage which can be the same as the first voltage, the regulation step value of the solar panel voltage is related to power varying ratio, which is similar to the variable step for PV converter working as voltage source converter.

As for the topology where there is a communication like among the first photovoltaic system 2, the second photovoltaic system 2 and the other power generators 70, 71, 72, 73, 74 75, the first photovoltaic system 2 and the second photovoltaic system 2 can be controlled individually according to the section of *Variable Step for PV Converter Working As Voltage Source Converter*. Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. A control system for controlling a photovoltaic converter, including:
   a first input, for receiving first signals indicating first sampling values of an input current of the photovoltaic converter provided by a solar panel;
   a second input, for receiving second signals indicating second sampling values of an input voltage of the photovoltaic converter provided by the solar panel;
   a third input, for receiving third signals indicating third sampling values of an output voltage of the photovoltaic converter; and
   a controller, for first regulating the output voltage of the photovoltaic converter in a direction towards a reference voltage based on the third sampling value by regulating the input voltage by first voltage change of a first predetermined level;
   wherein:
   the controller is further adapted for monitoring a trend of the input voltage and power provided by the solar panel based on the first sampling values and the second sampling values for the previous sampling time points and the current sampling time point, and suspending the first regulation in case that the trend changes.

2. The control system according to claim 1, wherein:
   the controller is further adapted for second regulating the input voltage by a second voltage change of a second predetermined level in a direction opposite to the first voltage change in case that the trend changes.

3. The control system according to claim 2, wherein:
   for the first regulation and the second regulation, the controller is further adapted for providing control signals to the photovoltaic converter.

4. The control system according to claim 2, wherein:
   the controller is further adapted for:
   adjusting the second predetermined level depending on a level of voltage difference between the output voltage and the reference voltage, and the second predetermined level increases as the level of voltage difference increases; or
   adjusting the second predetermined level depending on a level of the solar panel power difference between present sampling time point and the previous sampling point, and the second predetermined level increases as the level of the solar panel power difference increases.

5. The control system according to claim 2, wherein:
   the controller is further adapted for:
   adjusting the first predetermined level depending on a level of voltage difference between the output voltage and the reference voltage, and the first predetermined level increases as the level of voltage difference increases; or
   adjusting the first predetermined level depending on a level of the solar panel power difference between present sampling time point and the previous sampling point, and the first predetermined level increases as the level of the solar panel power difference increases.

6. The control system according to claim 3, wherein:
   the controller is further adapted for:
   adjusting the first predetermined level depending on a level of voltage difference between the output voltage and the reference voltage, and the first predetermined level increases as the level of voltage difference increases; or
   adjusting the first predetermined level depending on a level of the solar panel power difference between present sampling time point and the previous sampling point, and the first predetermined level increases as the level of the solar panel power difference increases.

7. The control system according to claim 3, wherein:
   the controller is further adapted for:
   adjusting the second predetermined level depending on a level of voltage difference between the output voltage and the reference voltage, and the second predetermined level increases as the level of voltage difference increases; or
   adjusting the second predetermined level depending on a level of the solar panel power difference between present sampling time point and the previous sampling point, and the second predetermined level increases as the level of the solar panel power difference increases.

8. The control system according to claim 1, wherein:
   the controller is further adapted for:
   adjusting the first predetermined level depending on a level of voltage difference between the output voltage and the reference voltage, and the first predetermined level increases as the level of voltage difference increases; or
   adjusting the first predetermined level depending on a level of the solar panel power difference between present sampling time point and the previous sampling point, and the first predetermined level increases as the level of the solar panel power difference increases .

9. The control system according to claim 1, wherein:
   the trend is that the input voltage increases while the output power of the solar panel increases and vice versa.

10. The photovoltaic system using the control system according to claim 1, including:
    the solar panel; and
    the photovoltaic converter, for outputting the output voltage of the photovoltaic converter at its output.

11. A micro-grid, including:
    a bus; and
    the photovoltaic system according to claim 10;
    wherein:
    the output of the photovoltaic converter of the photovoltaic system is electrically coupled to the bus.

12. A control method for controlling a photovoltaic converter, including:
    receiving first signals indicating first sampling values of an input current of the photovoltaic converter provided by a solar panel;
    receiving second signals indicating second sampling values of an input voltage of the photovoltaic converter provided by the solar panel;
    receiving third signals indicating third sampling value of an output voltage of the photovoltaic converter; and
    monitoring a trend of the input voltage and power of the solar panel based on the first sampling values and the second sampling values for the previous sampling time points and the current sampling time point, in case that the trend remains unchanged, first regulating the output voltage of the photovoltaic converter based on the third sampling value in a direction towards a reference voltage by first regulating the input voltage by first voltage change of a first predetermined level, otherwise suspending the first regulation.

13. The control method according to claim 12, further including:
second regulating the input voltage by a second voltage change of a second predetermined level in a direction opposite to the first voltage change in case the trend changes.

14. The control method according to claim 13, further including:
for the first regulation and the second regulation, providing control signals to the photovoltaic converter.

15. The control method according to claim 14, further including:
adjusting the second predetermined level depending on a level of voltage difference between the output voltage and the reference voltage, and the second predetermined level increases as the level of voltage difference increases; or
adjusting the second predetermined level depending on a level of the solar panel power difference between present sampling time point and the previous sampling point, and the second predetermined level increases as the level of the solar panel power difference increases.

16. The control method according to claim 13, further including:
adjusting the second predetermined level depending on a level of voltage difference between the output voltage and the reference voltage, and the second predetermined level increases as the level of voltage difference increases; or
adjusting the second predetermined level depending on a level of the solar panel power difference between present sampling time point and the previous sampling point, and the second predetermined level increases as the level of the solar panel power difference increases.

17. The control method according to claim 13, further including:
adjusting the first predetermined level depending on a level of voltage difference between the output voltage and the reference voltage, and the first predetermined level increases as the level of voltage difference increases; or
adjusting the first predetermined level depending on a level of the solar panel power difference between present sampling time point and the previous sampling point, and the first predetermined level increases as the level of the solar panel power difference increases.

18. The control method according to claim 13, wherein:
the trend is that the input voltage increases while the output power of the solar panel increases and vice versa.

19. The control method according to claim 12, further including:
adjusting the first predetermined level depending on a level of voltage difference between the output voltage and the reference voltage, and the first predetermined level increases as the level of voltage difference increases; or
adjusting the first predetermined level depending on a level of the solar panel power difference between present sampling time point and the previous sampling point, and the first predetermined level increases as the level of the solar panel power difference increases.

20. The control method according to claim 12, wherein:
the trend is that the input voltage increases while the output power of the solar panel increases and vice versa.

* * * * *